(12) United States Patent
Lee

(10) Patent No.: US 11,398,281 B2
(45) Date of Patent: Jul. 26, 2022

(54) SEMICONDUCTOR MEMORY DEVICE AND METHOD OF OPERATING THE SAME

(71) Applicant: SK hynix Inc., Icheon-si (KR)

(72) Inventor: Hee Youl Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/212,759

(22) Filed: Mar. 25, 2021

(65) Prior Publication Data

US 2022/0101928 A1  Mar. 31, 2022

(30) Foreign Application Priority Data

Sep. 25, 2020 (KR) .......................... 10-2020-0124984

(51) Int. Cl.
| G11C 7/00 | (2006.01) |
| G11C 16/26 | (2006.01) |
| G11C 16/10 | (2006.01) |
| G11C 16/04 | (2006.01) |
| G11C 11/56 | (2006.01) |

(52) U.S. Cl.
CPC .......... *G11C 16/26* (2013.01); *G11C 16/0483* (2013.01); *G11C 16/10* (2013.01); *G11C 11/56* (2013.01)

(58) Field of Classification Search
CPC ....... G11C 7/1078; G11C 7/22; G11C 7/1006; G11C 7/1072; G11C 7/1096
USPC ....................................... 365/189.16, 189.14
See application file for complete search history.

(56) References Cited

U.S. PATENT DOCUMENTS

| 6,757,193 | B2 | 6/2004 | Chen et al. |
| 8,391,062 | B2 | 3/2013 | Jang |
| 2010/0070692 | A1 | 3/2010 | Litsyn et al. |
| 2014/0254272 | A1 | 9/2014 | Sharon et al. |
| 2015/0135025 | A1* | 5/2015 | Kim .................... G06F 11/1048 714/704 |

FOREIGN PATENT DOCUMENTS

| KR | 1020100137128 A | 12/2010 |
| KR | 1020150024141 A | 3/2015 |
| KR | 1020190002358 A | 1/2019 |

* cited by examiner

*Primary Examiner* — Son T Dinh
(74) *Attorney, Agent, or Firm* — William Park & Associates Ltd.

(57) ABSTRACT

A semiconductor memory device, and a method of operating the same, includes a memory cell array and a peripheral circuit. The memory cell array includes memory cells, each storing N bits of data. The peripheral circuit performs a program operation on a physical page including selected memory cells. The peripheral circuit is configured to receive pieces of data of N logical pages and program the pieces of data of the N logical pages to the physical page based on a logic code. The logic code is determined to equalize numbers of sensing operations required to read the pieces of data of the N logical pages. Weak read levels are assigned, using the logic code, to read data of a logical page for which the number of sensing operations is smallest.

19 Claims, 14 Drawing Sheets

FIG. 9

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0124984 filed on Sep. 25, 2020, in the Korean Intellectual Property Office, the entire disclosure of which is incorporated by reference herein.

BACKGROUND

1. Technical Field

Various embodiments of the present disclosure generally relate to an electronic device, and more particularly to a semiconductor memory device and a method of operating the semiconductor memory device.

2. Related Art

A memory device may have a two-dimensional (2D) structure in which strings are horizontally arranged on a semiconductor substrate. Alternatively, a memory device may have a three-dimensional (3D) structure in which strings are vertically stacked on a semiconductor substrate. As memory devices having a 2D structure are reaching their physical scaling limit (i.e., limit in the degree of integration), 3D memory devices including a plurality of memory cells vertically stacked on a semiconductor substrate are being increasingly produced.

SUMMARY

Various embodiments of the present disclosure are directed to a semiconductor memory device, which can improve read performance of programmed data after programming of data, and a method of operating the semiconductor memory device.

An embodiment of the present disclosure may provide for a semiconductor memory device. The semiconductor memory device may include a memory cell array and a peripheral circuit. The memory cell array may include a plurality of memory cells, each of which stores N bits of data, where N is a natural number of 2 or more. The peripheral circuit may be configured to perform a program operation on a physical page including memory cells selected from among the plurality of memory cells. The peripheral circuit is configured to receive data corresponding to N logical pages and program the data corresponding to the N logical pages to the physical page based on a logic code. The logic code may be determined to equalize numbers of sensing operations required to read the data corresponding to the N logical pages, respectively. Weak read levels may be assigned, according to the logic code, to read data of a logical page, among the N logical pages, for which the number of sensing operations is smallest.

In an embodiment, N may be 3 and each of the selected memory cells may be determined to belong to any one of eight threshold voltage states.

In an embodiment, first to seventh read levels may be used to distinguish the eight threshold voltage states, and the weak read levels may be a first read level and a seventh read level, among the first to seventh read levels.

In an embodiment, the logic code may be configured such that a second read level, a fourth read level, and a sixth read level are used to read data corresponding to a first logical page among the three logical pages, a third read level and a seventh read level are used to read data corresponding to a second logical page among the three logical pages, and a first read level and a fifth read level are used to read data corresponding to a third logical page among the tree logical pages.

In an embodiment, N may be 5 and each of the selected memory cells may be determined to belong to any one of 32 threshold voltage states.

In an embodiment, first to 31-st read levels may be used to distinguish the 32 threshold voltage states from each other, and the weak read levels may be a first read level, a second read level, a 30-th read is level, and a 31-st read level.

In an embodiment, the logic code may be configured such that ninth, eleventh, fourteenth, 25-th, 27-th, and 30-th read levels are used to read data corresponding to a first logical page among the five logical pages, second, sixth, eighth, eighteenth, 22-nd, and 24-th read levels are used to read data corresponding to a second logical page among the five logical pages, first, seventh, sixteenth, nineteenth, 21-st, and 28-th read levels are used to read data corresponding to a third logical page among the five logical pages, fourth, twelfth, twentieth, 26-th, 29-th, and 31-st read levels are used to read data corresponding to a fourth logical page among the five logical pages, and third, fifth, tenth, thirteenth, fifteenth, seventeenth, and 23-rd read levels are used to read data corresponding to a fifth logical page among the five logical pages.

In an embodiment, the logic code may be a gray code.

An embodiment of the present disclosure may provide for a method of operating a semiconductor memory device including a plurality of memory cells, wherein each of the memory cells stores N bits of data and memory cells included in one physical page store data corresponding to N logical pages. The method may include receiving data corresponding to N logical pages from a memory controller, determining threshold voltage states of memory cells selected from among the plurality of memory cells based on the data corresponding to the N logical pages and a logic code, and programming the selected memory cells based on the determined threshold voltage states. The logic code may be determined to equalize numbers of sensing operations required to read the data corresponding to the N logical pages, respectively. Weak read levels may be assigned, according to the logic code, to read data of a logical page, among the N logical pages, for which the number of sensing operations is smallest.

In an embodiment, N may be 3 and each of the selected memory cells may be determined to belong to any one of eight threshold voltage states.

In an embodiment, among the three logical pages, two sensing operations may be assigned to read a first logical page, two sensing operations are assigned to read a second logical page, and three sensing operations are assigned to read a third logical page.

In an embodiment, the weak read levels may be assigned to read the first and second logical pages.

In an embodiment, N may be 5 and each of the selected memory cells may be determined to belong to any one of 32 threshold voltage states.

In an embodiment, among the five logical pages, six sensing operations are assigned to read a first logical page, six sensing operations are assigned to read a second logical page, six sensing operations are assigned to read a third logical page, six sensing operations are assigned to read a fourth logical page, and seven sensing operations are assigned to read a fifth logical page.

In an embodiment, the weak levels may be assigned to read the first and second logical pages.

An embodiment of the present disclosure may provide for a semiconductor memory device. The semiconductor memory device may include a memory cell array and a peripheral circuit. The memory cell array may include a plurality of memory cells, each of which stores N bits of data, where N is a natural number of 2 or more. The peripheral circuit may be configured to perform a program operation on a physical page including memory cells selected from among the plurality of memory cells. The peripheral circuit may be configured to receive data corresponding to N logical pages and program the data corresponding to the N logical pages to the physical page based on a logic code. The logic code may be determined to equalize numbers of sensing operations required to read the data corresponding to the N logical pages, respectively. Among a first read level to a $(2^N-1)$-th read level having sequential magnitudes to distinguish $2^N$ threshold voltage states from each other, the first read level that is a lowest read level and the $(2^N-1)$-th read level that is a highest read level may be assigned to read data corresponding to different logical pages among the data corresponding to the N logical pages.

In an embodiment, N may be 3 and each of the selected memory cells may be determined to belong to any one of eight threshold voltage states, and a first read level and a seventh read level, among the first read level to the seventh read levels having sequential values, may be assigned to read data corresponding to different logical pages.

In an embodiment, N may be 5 and each of the selected memory is cells may be determined to belong to any one of 32 threshold voltage states, and a first read level and a 31-st read level, among the first read level to the 31-st read levels having sequential values, may be assigned to read data corresponding to different logical pages.

In an embodiment, among the first read level to the 31-st read level, the first read level, a second read level, a 30-th read level, and the 31-st read level may be assigned to read different logical pages, respectively.

BRIEF DESCRIPTION OF THE DRAWINGS

FIG. 9 is a diagram for describing a method of programming memory cells, each storing 5 bits of data, using a logic code according to an embodiment of the present disclosure.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Figure 1:
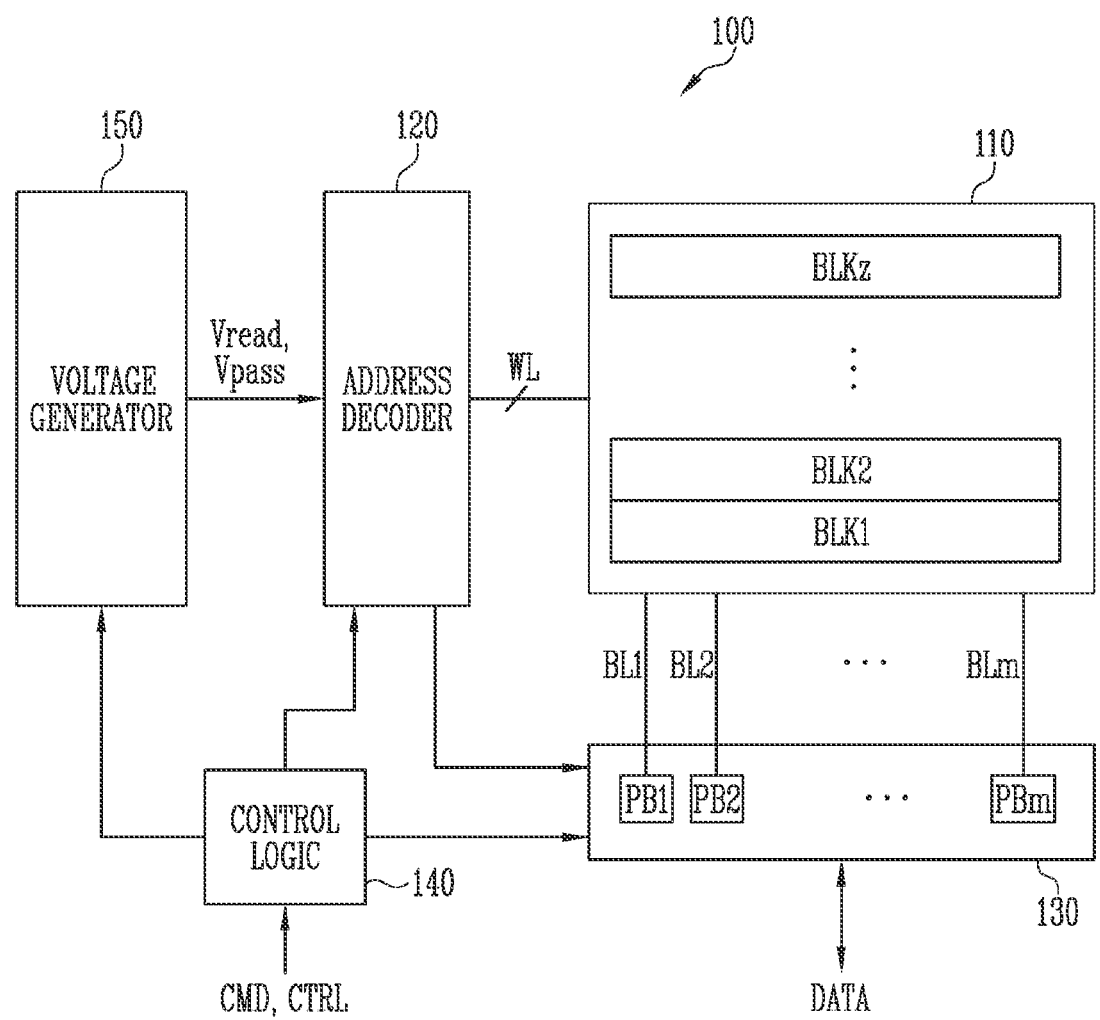
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, control logic 140, and a voltage generator 150.

The memory cell array 110 may include a plurality of memory blocks BLK1 to BLKz. The memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Meanwhile, each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In accordance with an embodiment, the memory cell array 110 may include a plurality of memory cells each of which stores 5 or more bits of data.

The address decoder 120, the read and write circuit 130, the control logic 140, and the voltage generator 150 are operated as peripheral circuits for driving the memory cell array 110. The address decoder 120 is coupled to the memory cell array 110 through the word lines WL. The address decoder 120 may be operated under the control of the control logic 140. The address decoder 120 receives addresses through an input/output buffer (not illustrated) provided in the semiconductor memory device 100.

The address decoder 120 may decode a block address, among the received addresses. The address decoder 120 selects at least one memory block based on the decoded block address. Further, when a read voltage apply operation is performed during a read operation, the address decoder 120 may apply a read voltage Vread, generated by the voltage generator 150, to a selected word line of a selected memory block, and may apply a pass voltage Vpass to remaining word lines, that is, unselected word lines. Further, during a program verify operation, the address decoder 120 may apply a verify voltage, generated by the voltage generator 150, to the selected word line of the selected memory block, and may apply the pass voltage Vpass to the remaining word lines, that is, unselected word lines.

The address decoder 120 may decode a column address among the received addresses. The address decoder 120 may transmit the decoded column address to the read and write circuit 130.

The read and program operations of the semiconductor memory device 100 are each performed on a page basis. Addresses received in response to a request for read and program operations may include a block address, a row address, and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation of the memory cell array 110. The plurality of page buffers PB1 to PBm are coupled to the memory cell array 110 through the bit lines BL1 to BLm. In order to sense threshold voltages of the memory cells during a read operation and a program verify operation, each of the page buffers PB1 to PBm may sense, through a sensing node, a change in the amount of flowing current depending on the program state of a corresponding memory cell and latch as sensing data while continuously supplying sensing current to the bit lines coupled to the memory cells. The read and write circuit 130 may be operated in response to page buffer control signals $CTR_{FB}$ output from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page registers).

The control logic 140 is coupled to the address decoder 120, the read and write circuit 130, and the voltage generator 150. The control logic 140 may be implemented as hardware, software, or a combination of hardware and software. For example, the control logic 140 may be a control logic circuit operating in accordance with an algorithm and/or a processor executing control logic code. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal $CTR_{PB}$ for controlling the plurality of page buffers PB1 to PBm included in the read and write circuit 130. The control logic 140 may control the read and write circuit 130 to perform a read operation of the memory cell array 110.

The voltage generator 150 may generate the read voltage Vread and the pass voltage Vpass required for a read operation in response to the control signal output from the control logic 140. In addition, the voltage generator 150 may generate voltages for generating various control signals required to control the operation of the semiconductor memory device.

Figure 2:
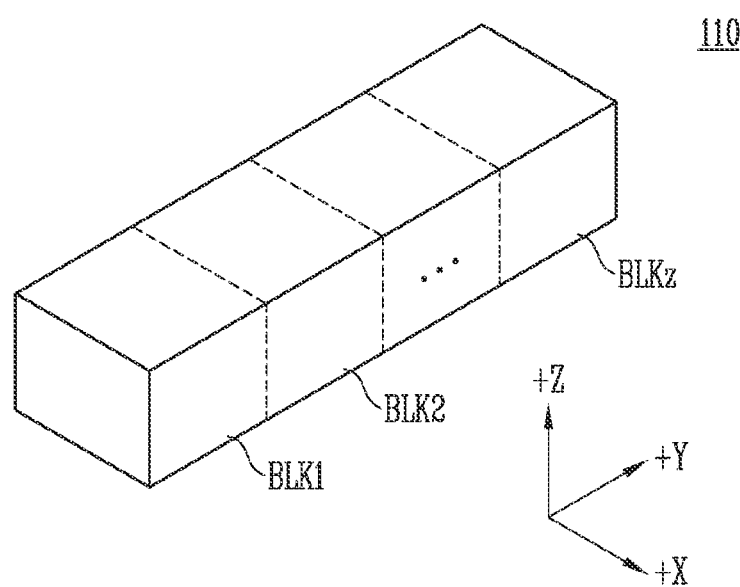
FIG. 2 is a block diagram illustrating an embodiment of a memory cell array 110 of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block has a three-dimensional (3D) structure. Each of the memory blocks may include a plurality of memory cells stacked on a substrate. The plurality of memory cells are arranged in +X, +Y, and +Z directions. The structure of each memory block will be described in more detail below with reference to FIGS. 3 and 4.

Figure 3:
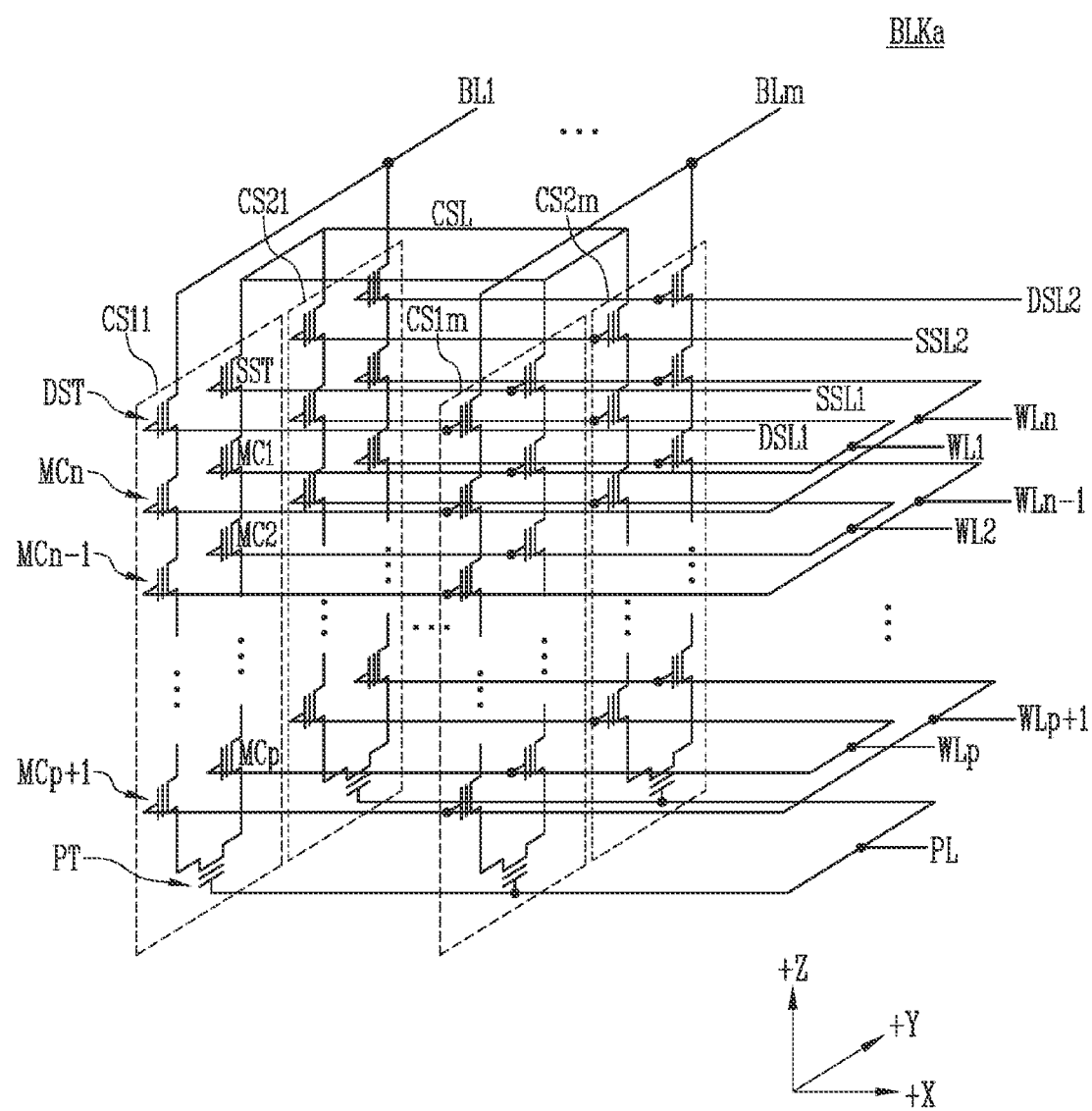
FIG. 3 is a circuit diagram illustrating an example of any one memory block BLKa of memory blocks BLK1 to BLKz of FIG. 2.

FIG. 3 is a circuit diagram illustrating any one memory block BLKa of memory blocks BLK1 to BLKz of FIG. 2.

Referring to FIG. 3, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., a positive (+) X direction). In FIG. 3, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, source select transistors of the cell strings CS11 to CS1$m$ and CS21 to CS2$m$ may be coupled in common to one source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. Gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings arranged in the row direction are coupled to drain select is lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 3, the cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may be decreased, whereas the reliability of operation of the memory block BLKa may be deteriorated.

In order to efficiently control the one or more dummy memory cells, respective dummy memory cells may have required threshold voltages. Before or after an erase operation on the memory block BLKa is performed, program operations may be performed on all or some of the dummy memory cells. When the erase operation is performed after the program operations have been performed, the respective dummy memory cells may have required threshold voltages by controlling voltages to be applied to dummy word lines coupled to respective dummy memory cells.

Figure 4:
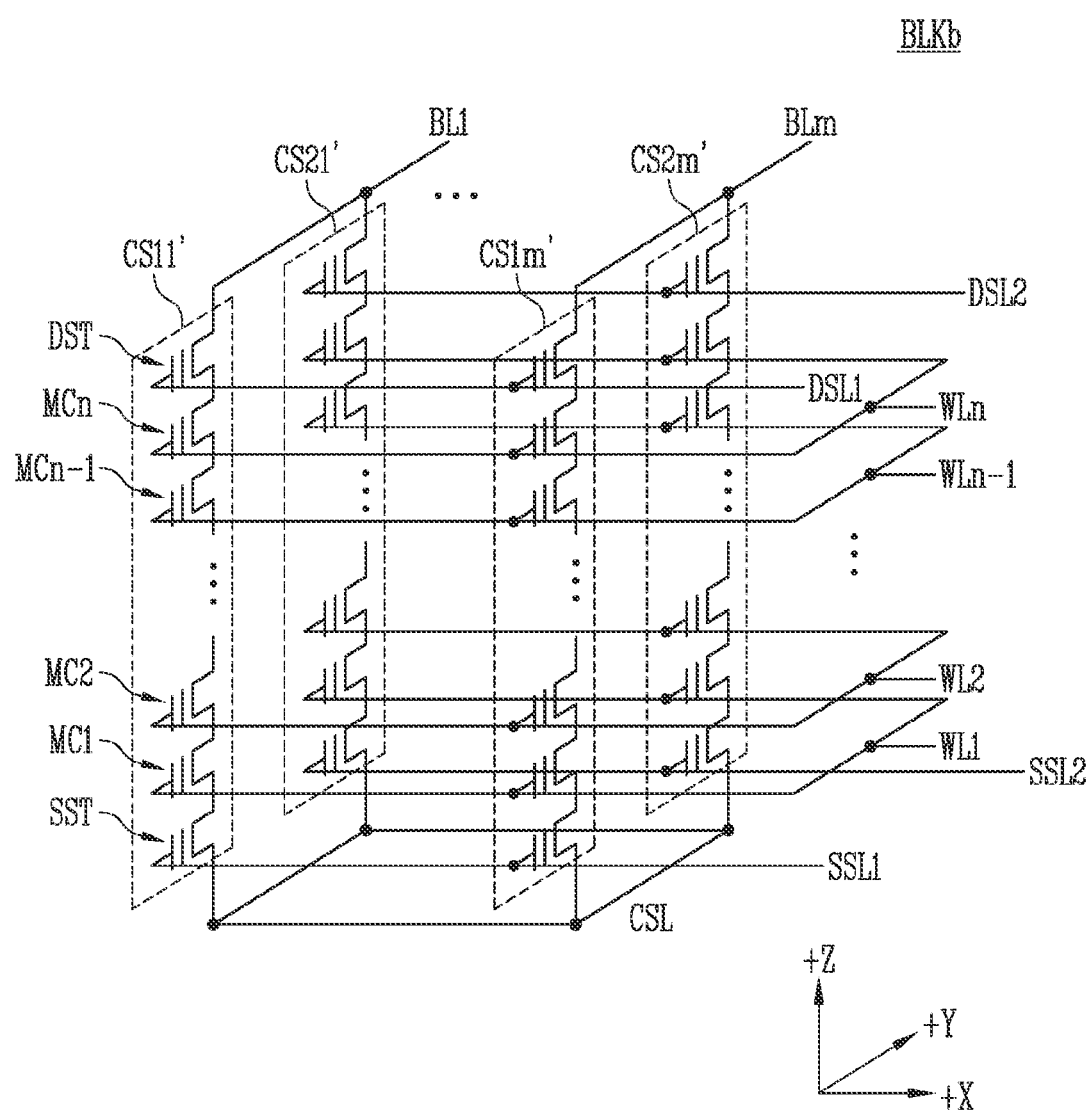
FIG. 4 is a circuit diagram illustrating an example of any one memory block BLKb of the memory blocks BLK1 to BLKz of FIG. 2.

FIG. 4 is a circuit diagram illustrating an example of any one memory block BLKb of the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' extends along a positive Z (+Z) direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected is between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 4 has an equivalent circuit similar to that of the memory block BLKa of FIG. 3 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the dummy memory cells may have required threshold voltages by controlling the voltages to be applied to the dummy word lines coupled to respective dummy memory cells.

Figure 5:
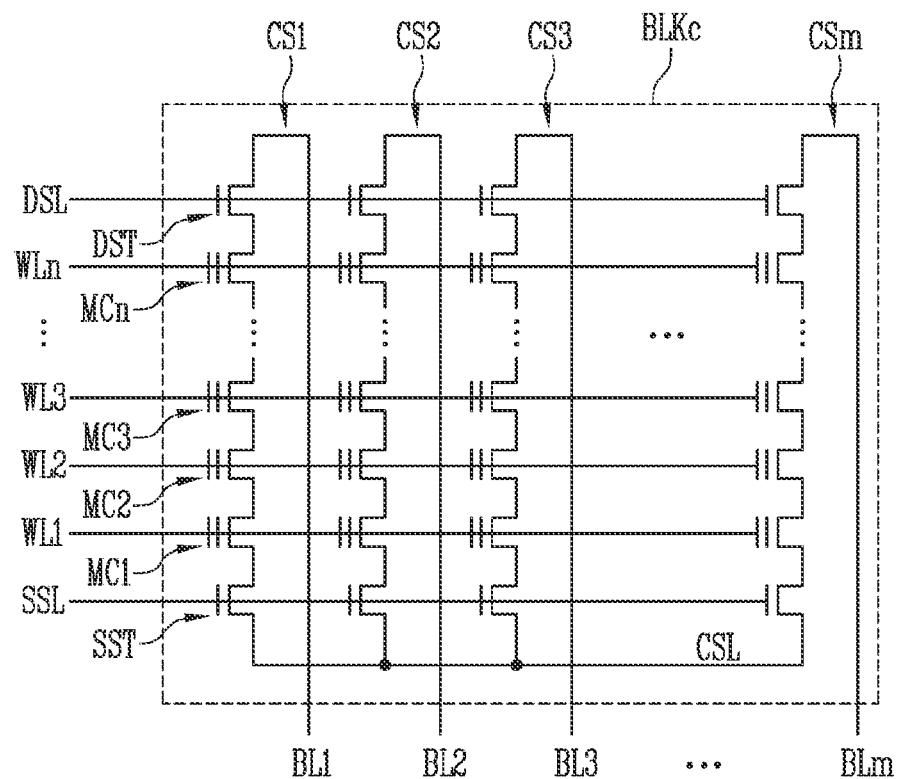
FIG. 5 is a circuit diagram illustrating an example of any one memory block BLKc of the memory blocks BLK1 to BLKz included in the memory cell array 110 of FIG. 1.

FIG. 5 is a circuit diagram illustrating an example of any one memory block BLKc of the memory blocks BLK1 to BLKz included in the memory cell array 110 of FIG. 1.

Referring to FIG. 5, the memory block BLKc may include a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As illustrated in FIGS. 2 to 4, the memory cell array 110 of the semiconductor memory device 100 may be implemented as a memory cell is array having a 3D structure. Further, as illustrated in FIG. 5, the memory cell array 110 of the semiconductor memory device 100 may be implemented as a memory cell array having a 2D structure.

FIGS. 6A to 6E are diagrams illustrating distributions of program states or voltage levels of memory cells included in a semiconductor memory device. The distributions illustrated in FIGS. 6A to 6E may be the distributions of program states or voltage levels of memory cells. In graphs of FIGS. 6A to 6E, an x axis denotes threshold voltages Vth of memory cells and a y axis denotes the number of memory cells.

Figure 6A:
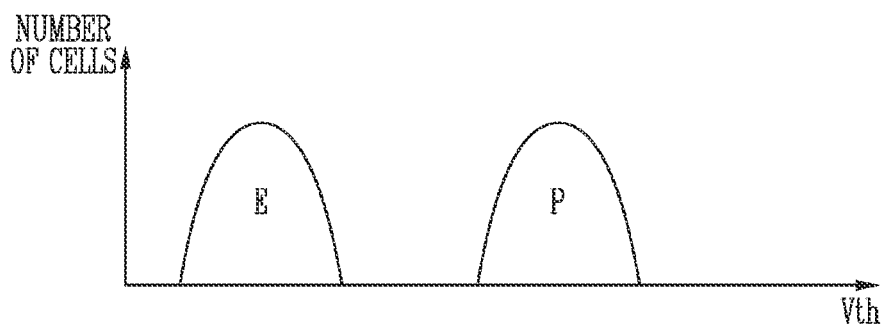
FIGS. 6A to 6E are diagrams illustrating distributions of program states or voltage levels of memory cells included in a semiconductor memory device.

Referring to FIG. 6A, when the memory cells included in a memory cell array 110 are single-level cells (SLC), each of the memory cells may belong to any one of an erased state E and a program state P. Because an SLC cell may be in any one of two different states, each memory cell may store one bit. In this case, a plurality of memory cells coupled to one word line may form one physical page, and one physical page may store data of one page (one piece of page data). One piece of page data may be data including bits corresponding to respective memory cells included in one physical page.

Figure 6B:
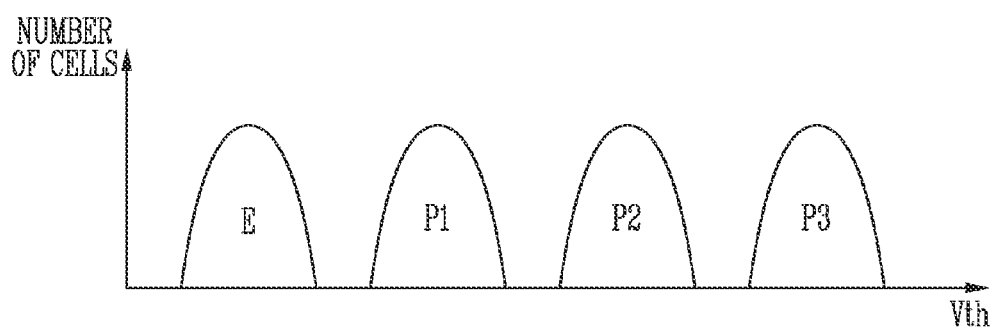

Referring to FIG. 6B, when memory cells included in the memory cell array 110 are multi-level cells (MLC), each of the memory cells may belong to an erased state E or any one of first to third program states P1 to P3. Because an MLC cell may be in a state corresponding to one of four different states, each cell may program or store two different bits depending on a predefined coding scheme. A first bit, which is an upper bit of two bits, may be referred to as a Most Significant Bit (MSB), and a second bit, which is a lower bit of the two bits, may be referred to as a Least Significant Bit (LSB). In this case, a plurality of memory cells coupled to one word line may form one physical page, and one physical page may store data of two logical pages, that is, MSB page data and LSB page data. The MSB page data may include MSBs stored in respective memory cells included in a physical page. The LSB page data may include LSBs stored in respective memory cells included in a physical page.

Figure 6C:
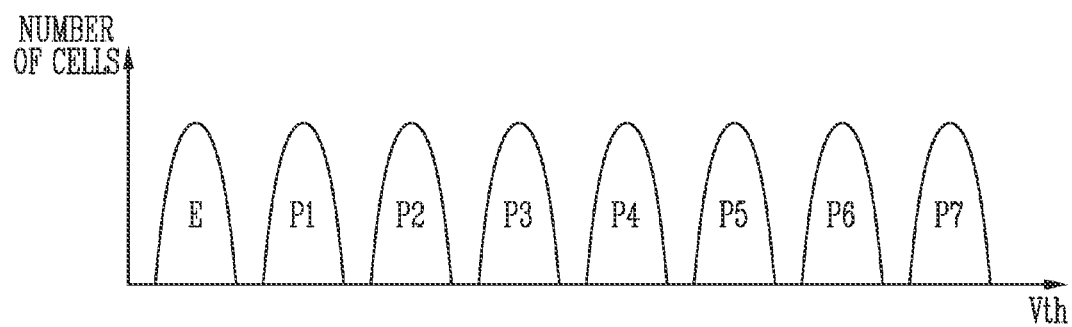

Referring to FIG. 6C, when the memory cells included in the memory cell array 110 are triple-level cells (TLC), each of the memory cells may belong to an erased state E or any one of first to seventh program states P1 to P7. Because a TLC cell may be in a state corresponding to one of eight different states, each cell may program or store three different bits depending on a predefined coding scheme. A first bit, which is an upper bit of three bits, may be referred to an MSB, a second bit, which is a central bit of the three bits, may be referred to as a Central Significant Bit (CSB), and a third bit, which is a lower bit of the three bits, may be referred to as an LSB. In this case, a plurality of memory cells coupled to one word line may form one physical page, and one physical page may store data of three logical pages, that is, MSB page data, CSB page data, and LSB page data. The MSB page data may include MSBs stored in respective memory cells included in a physical page. The CSB page data may include CSBs stored in respective memory cells included in a physical page. The LSB page data may include LSBs stored in respective memory cells included in a physical page.

Figure 6D:
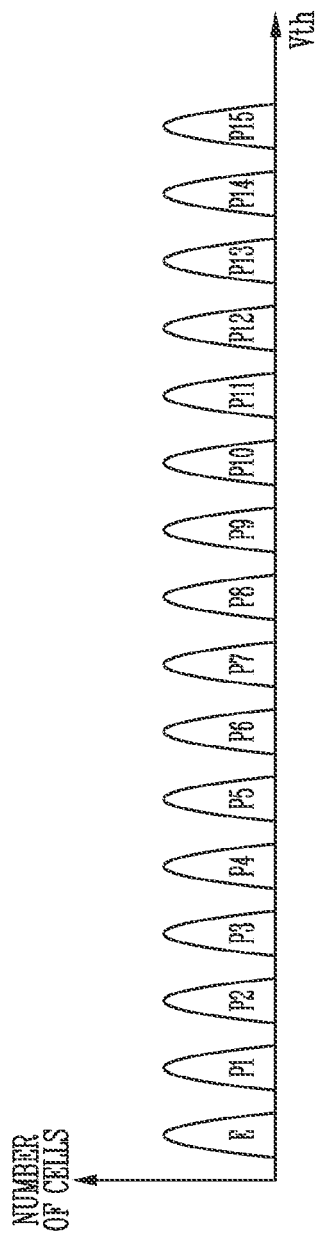

Referring to FIG. 6D, when memory cells included in the memory cell array 110 are quad-level cells (QLC), each of the memory cells may belong to an erased state E or any one of first to fifteenth program states P1 to P15. Because a QLC cell may be in a state corresponding to one of 16 different states, each cell may program or store four different bits depending on a predefined coding scheme. A first bit, which is an upper bit of four bits, may be referred to an MSB, a second bit, which is an upper central bit of the four bits, may be referred to as a High Central Significant Bit (HCSB), a third bit, which is a lower central bit of the four bits, may be referred to as a Low CSB (LCSB), and a fourth bit, which is a lower bit of the four bits, may be referred to as an LSB. In this case, a plurality of memory cells coupled to one word line may form one physical page, and one physical page may store data of four logical pages, that is, MSB page data, HCSB page data, LCSB page data, and LSB page data. The MSB page data may include MSBs stored in respective memory cells included in a physical page. The HCSB page data may include HCSBs stored in respective memory cells included in a physical page. The LCSB page data may include LCSBs stored in respective memory cells included in a physical page. The LSB page data may include LSBs stored in respective memory cells included in a physical page.

Figure 6E:
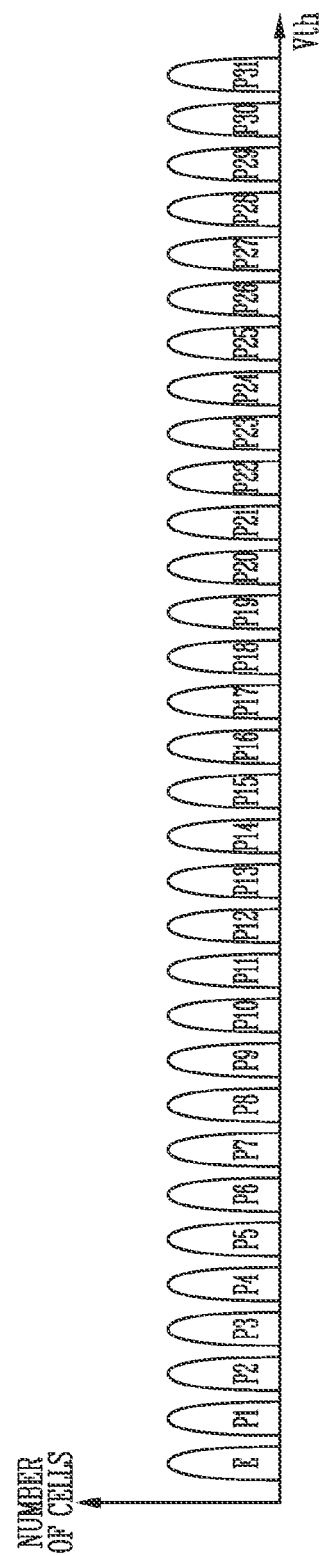

Referring to FIG. 6E, when memory cells included in the memory cell array 110 are cells for storing 5 bits of data, each of the memory cells may belong to an erased state E or any one of first to 31-st program states P1 to P31. In this case, a plurality of memory cells coupled to one word line may form one physical page, and one physical page may store data of five logical pages, that is, first page data to fifth page data.

As illustrated in FIGS. 6A to 6E, the number of program states by which threshold voltages of memory cells are distinguished from each other may vary depending on the number of bits stored in each of the memory cells included in the memory cell array 110.

Figure 7:
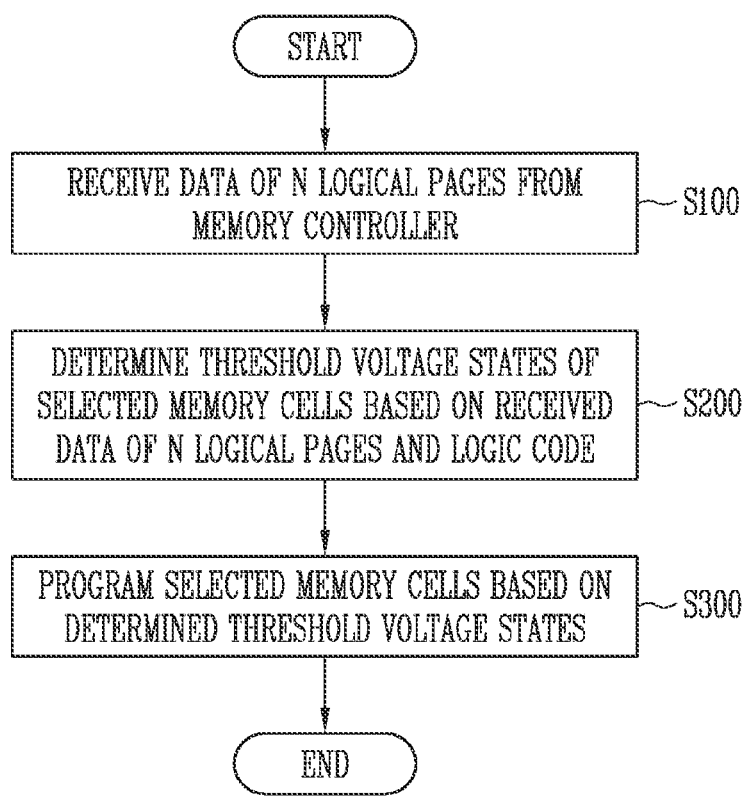
FIG. 7 is a flowchart illustrating a method of operating a semiconductor memory device according to an embodiment of the present disclosure.

FIG. 7 is a flowchart illustrating a method of operating a semiconductor memory device according to an embodiment of the present disclosure.

Referring to FIG. 7, the method of operating the semiconductor memory device according to an embodiment of the present disclosure may include the step S100 of receiving data of N logical pages from a memory controller, the step S200 of determining the threshold voltage states of selected memory cells based on the received data of N logical pages and a logic code, and the step of programming the selected memory cells based on the determined threshold voltage states.

At step S100, the semiconductor memory device 100 may receive a program command, a program address, and program data from the memory controller. The program command may be a command for controlling the semiconductor memory device 100 to perform a program operation. The program address may be an address indicating the location of a physical page on which the program operation is to be performed. Meanwhile, the semiconductor memory device 100 may sequentially receive data of N logical pages from the memory controller. In an embodiment of the present disclosure, N may be a natural number of 3 or more. When the memory cells included in the memory cell array 110 of the semiconductor memory device 100 are TLCs, the semiconductor memory device may receive MSB page data, CSB page data, and LSB page data which are to be stored in a physical page corresponding to the program address at step S100. When the memory cells included in the memory cell array 110 of the semiconductor memory device 100 are QLCs, the semiconductor memory device may receive MSB page data, HCSB page data, LCSB page data, and LSB page data which are to be stored in a physical page corresponding to the program address at step S100. When the memory cells included in the memory cell array 110 of the semiconductor memory device 100 are memory cells, each of which stores 5 bits of data, the semiconductor memory device may receive first page data to fifth page data which are to be stored in a physical page corresponding to the program address at step S100.

At step S200, the threshold voltage states of the selected memory cells may be determined based on the received data of N logical pages and the preset logic code. The logic code may be a code for mapping pieces of data to be stored in respective memory cells and the threshold voltages of the corresponding memory cells to each other.

At step S200, the semiconductor memory device 100 according to an embedment of the present disclosure may determine the threshold voltage states of selected memory cells depending on the received data of N logical pages based on a logic code having at least one of the following features (i) to (iv).

Feature (i) "Gray Code"

The logic code used in a program operation of the semiconductor memory device according to an embodiment of the present disclosure may be a gray code. For bit data of each of a plurality of program states, when pieces of bit data corresponding to adjacent program states have a difference of only 1 bit, such a code may be designated as a gray code. When pieces of data of N logical pages (i.e., N pieces of logical page data) are programmed using the gray code, an error of only 1 bit is included in the logical page data even if a sensing error occurs in a subsequent read process, and thus an advantage may be obtained in error correction.

Feature (ii) "Equalization of the Numbers of Sensing Operations for Reading Logical Page Data"

Depending on a scheme for configuring a logic code, the number of sensing operations for reading each of N logical pages may vary. In an example, the logic code may be configured such that a deviation between the numbers of sensing operations for respectively reading N logical pages is a large value or such that the deviation between the numbers of sensing operations for respectively reading N logical pages is minimized. In accordance with the semiconductor memory device and the method of operating the semiconductor memory device according to an embodiment of the present disclosure, the threshold voltage states of selected memory cells may be determined using the logic code that is configured to minimize the deviation between the numbers of sensing operations for respectively reading N logical pages. In this case, the read performance of the semiconductor memory device 100 may be improved because the deviation between read times indicating the times required in order to respectively read N logical pages is also minimized.

When the logic code configured to minimize the deviation between the numbers of sensing operations of respectively reading N logical pages is used according to the semiconductor memory device 100 and the method of operating the semiconductor memory device according to an embodiment of the present disclosure, a relationship shown in the following Equation (1) may be established for the corresponding logic code.

$$N_{RMAX} - N_{Rmin} \leq N_{TH} \qquad (1)$$

In the above-described Equation (1), $N_{RMAX}$ denotes the number of sensing operations of logical page data which requires a largest number of sensing operations, among N pieces of logical page data, and $N_{Rmin}$ denotes the number of sensing operations of logical page data which requires a smallest number of sensing operations, among the N pieces of logical page data. Therefore, "$N_{RMAX} - N_{Rmin}$" denote the deviation between the numbers of sensing operations required in order to read the N pieces of logical page data, respectively.

Further, $N_{TH}$ denotes a value suitably determined according to the number of bits stored in each memory cell. For example, when the memory cells included in the memory cell array 110 of the semiconductor memory device 100 are TLC, $N_{TH}$ may be set to 1. This means that the logic code is configured such that the deviation between the numbers of sensing operations for respectively reading three pieces of logical page data included in a physical page is less than or equal to 1. In an example, when each of the memory cells included in the memory cell array 110 of the semiconductor memory device 100 stores 5 bits, $N_{TH}$ may be set to 2. This means that the logic code is configured such that the deviation between the numbers of sensing operations for respectively reading five pieces of logical page data included in a physical page is less than or equal to 2.

Feature (iii) "Assignment of Weak Read Level to Logical Page Having the Smallest Number of Sensing Operations"

In the case of a physical page which stores N pieces of logical page data, $2^N-1$ read levels are required in order to sense respective program states. Depending on the foregoing features (ii), the numbers of sensing operations for reading respective pieces of logical page data may be equalized. However, even in this case, there may be a logical page requiring a number of sensing operations corresponding to $N_{RMAX}$ and a logical page requiring a number of sensing operations corresponding to $N_{Rmin}$, respectively. In accordance with the semiconductor memory device and the method of operating the semiconductor memory device according to the embodiment of the present disclosure, N pieces of logical page data are programmed using a logic code which assigns a weak read level to a logical page requiring $N_{Rmin}$ sensing operations.

A weak read level may mean a read level that makes it difficult to find a boundary between program states because relatively large movement of threshold voltage distributions occurs due to disturb or retention. For example, referring to FIG. 6C, memory cells corresponding to an erased state E may be vulnerable to program disturb, and thus it may be difficult to find a boundary between the erased state E and the first program state P1, and a sensing error may relatively frequently occur in the corresponding area. Therefore, a first read level R1 for distinguishing the erased state E from the first program state P1 may be included in weak read levels. Meanwhile, memory cells corresponding to a seventh program state P7 having a high threshold voltage are vulnerable to retention, and thus it may be difficult to find a boundary between the sixth program state P6 and the seventh program state P7, and a sensing error may relatively frequently occur in the corresponding area. Therefore, a seventh read level R7 for distinguishing the sixth program state P6 from the seventh program state P7 may be included in weak read levels.

In accordance with an embodiment of the present disclosure the present disclosure, N pieces of logical page data are programmed using a logic code which assigns a weak read level to a logical page requiring $N_{Rmin}$ sensing operations. Therefore, because a weak read level is assigned to a logical page which requires a relatively small number of sensing operations, a sensing error may be minimized.

Feature (iv) "Assignment of a Plurality of Weak Read Levels to Different Logical Pages"

As described above with reference to FIG. 6C in features (iii), there may be a plurality of weak read levels. In this case, when the plurality of weak read levels are intensively assigned to one logical page, the probability of occurrence of a read error may increase. Therefore, in accordance with the semiconductor memory device and the method of operating the semiconductor memory device according to an embodiment of the present disclosure, a logic code is configured to assign a plurality of weak read levels to different logical pages. Therefore, an error rate occurring in a read operation may be reduced.

In accordance with the semiconductor memory device 100 and the method of operating the semiconductor memory device according to an embodiment of the present disclosure, the threshold voltage states of selected memory cells may be determined depending on received N pieces of logical page data, based on the logic code having at least one of the foregoing features (i) to (iv). Therefore, during a read operation after a program operation, the probability of occurrence of a read error may be minimized. The features (i) to (iv) of the logic code used in the semiconductor memory device 100 and the method of operating the semiconductor memory device according to an embodiment of the present disclosure will be described in detail later with reference to FIGS. 8A and 8B.

When the threshold voltage states of the selected memory cells are determined at step S200, the selected memory cells are programmed based on the determined threshold voltage states at step S300. That is, the peripheral circuit of the semiconductor memory device 100 may program the selected memory cells based on the logic code having at least one of the foregoing features (i) to (iv).

Figure 8A:
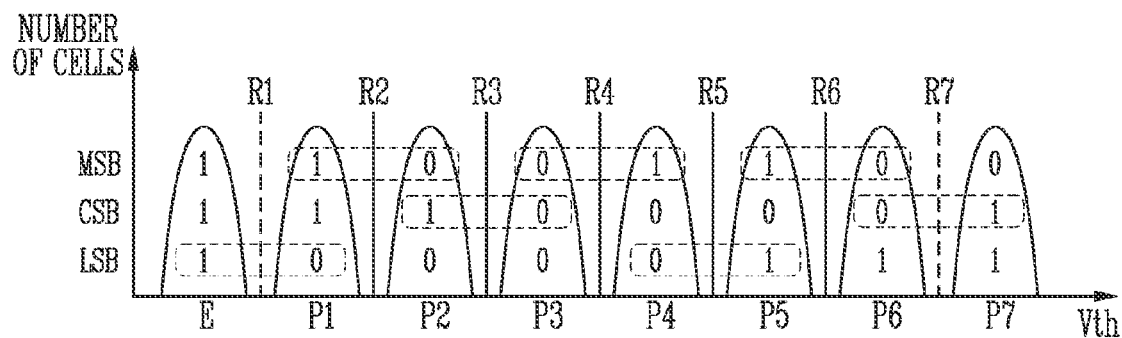
FIG. 8A is a diagram for describing a method of programming memory cells, each storing 3 bits of data, using a logic code according to an embodiment of the present disclosure.
Figure 8B:
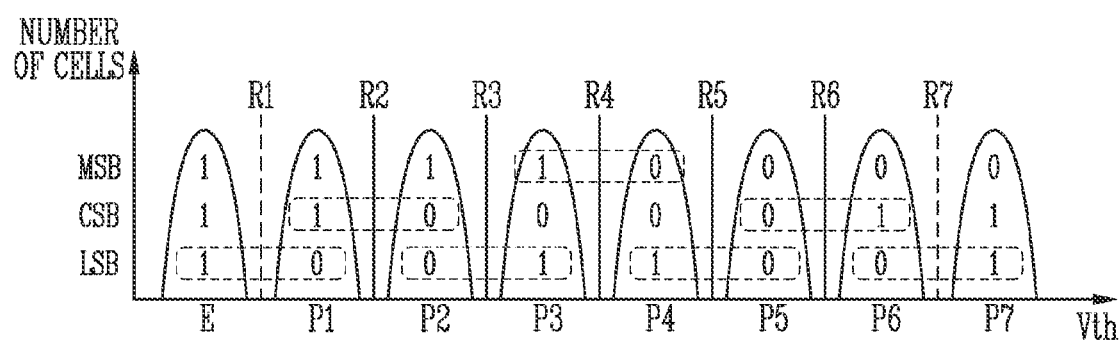
FIG. 8B is a diagram for describing the features of the present disclosure in comparison with FIG. 8A.

FIG. 8A is a diagram for describing a method of programming memory cells, each storing 3 bits of data, using a logic code according to an embodiment of the present disclosure. FIG. 8B is a diagram for explaining the features of the present disclosure in comparison with FIG. 8A. Below, the features (i) to (iv) of the logic code according to an embodiment of the present disclosure will be described with reference to FIGS. 8A and 8B together.

Referring to FIG. 8A, the threshold voltage states of memory cells determined based on logic code according to an embodiment of the present disclosure are illustrated. In FIG. 8A, memory cells which store bits "1 1 1" in the order of MSB-CSB-LSB are maintained in an erased state E. Memory cells which store bits "1 1 0" are programmed to a first program state P1. In this way, memory cells which store bits "0 1 0", "0 0 0", "1 0 0", "1 0 1", "0 0 1", and "0 1 1" are programmed to second to seventh program states P2 to P7, respectively. In order to distinguish the threshold voltage states of respective memory cells from each other, first to seventh read levels R1 to R7 may be used.

Referring to FIG. 8A, as indicated by dashed boxes, an erased state E and a first program state P1 are different from each other only in LSB. That is, the erased state E and the first program state P1 have the same MSB, that is, 1, and have the same CSB, that is, 1. Further, the erased state E and the first program state P1 have different LSB values in such a way that the LSB of the erased state E is 1, whereas the LSB of the first program state P1 is 0. Meanwhile, the first program state P1 and the second program state P2 are different from each other only in CSB. Furthermore, the second program state P2 and the third program state P3 are different from each other only in CSB. As described above, according to the threshold voltage states illustrated in FIG. 8A, pieces of bit data corresponding to adjacent program states have a difference corresponding to only 1 bit therebetween. That is, FIG. 8A corresponds to the threshold voltage state of memory cells programmed based on feature (i) "gray code."

Referring to FIG. 8A, in order to read data of an MSB page, the threshold voltages of memory cells should be sensed using a second read level R2, a fourth read level R4, and a sixth read level R6. Further, in order to read data of a CSB page, the threshold voltages of memory cells should be sensed using a third read level R3 and a seventh read level R7. Meanwhile, in order to read data of an LSB page, the threshold voltages to of memory cells should be sensed using a first read level R1 and a fifth read level R5. Meanwhile, in FIG. 8A, the first read level R1 vulnerable to disturb and the seventh read level R7 vulnerable to retention are indicated by dotted lines as weak read levels. These are summarized in the following Table 1.

TABLE 1

| Logical Page | Read Level | Number of sensing operations | Weak Read Level |
|---|---|---|---|
| MSB | R2, R4, R6 | 3 | X |
| CSB | R3, R7 | 2 | R7 |
| LSB | R1, R5 | 2 | R1 |

Referring to Table 1, the number of sensing operations required to read an MSB page is 3, and the number of sensing operations required to read each of a CSB page and an LSB page is 2. It can be seen from the foregoing Equation (1) that the logic code has been configured such that $N_{RMAX}$ has a value of 3, $N_{Rmin}$ has a value of 2, and $N_{TH}$ has a value of 1. Therefore, referring to Table 1, the logic code has been configured such that (ii) "the numbers of sensing operations for reading logical page data are equalized."

Meanwhile, the weak read levels are the first read level R1 and the seventh read level R7. The first read level R1 is assigned to the LSB page for which the number of sensing operations is 2, and the seventh read level R7 is assigned to the CSB page for which the number of sensing operations is 2. Therefore, it can be seen that (iii) "the weak read levels R1 and R7 are assigned to logical page data (LSB and CSB) for which the number of sensing operations is the smallest."

Finally, it can be seen that (iv) "a plurality of weak read levels R1 and R7 are decentralized and assigned to different pieces of logical page data (LSB and CSB)" rather than being assigned to any one logical page.

Referring to FIG. 8B, it can be seen that, similar to FIG. 8A, (i) threshold voltage states of memory cells programmed based on the gray is code are illustrated. Meanwhile, referring to FIG. 8B, in order to read data of an MSB page, the threshold voltages of the memory cells should be sensed using a fourth read level R4. Further, in order to read data of a CSB page, the threshold voltages of memory cells should be sensed using a second read level R2 and a sixth read level R6. Furthermore, in order to read data of an LSB page, the threshold voltages of memory cells should be sensed using a first read level R1, a third read level R3, and a seventh read level R7. Meanwhile, in FIG. 8B, the first read level R1 vulnerable to disturb and the seventh read level R7 vulnerable to retention are indicated by dotted lines as weak read levels. These are summarized in the following Table 2.

TABLE 2

| Logical Page | Read Level | Number of sensing operations | Weak Read Level |
|---|---|---|---|
| MSB | R4 | 1 | X |
| CSB | R2, R6 | 2 | X |
| LSB | R1, R3, R5, R7 | 4 | R1, R7 |

Referring to Table 2, the number of sensing operations required to read an MSB page is 1, the number of sensing operations required to read a CSB page is 2, and the number of sensing operations required to read an LSB page is 4. It can be seen from the foregoing Equation (1) that the logic code has been configured such that $N_{RMAX}$ has a value of 4 and $N_{Rmin}$ has a value of 1. As described above with reference to FIG. 8A, when $N_{Rmin}$ has a value of 1, $N_{RMAX}$ and $N_{Rmin}$ of Table 2 do not satisfy the relationship of Equation (1). That is, referring to Table 2, it can be seen that, unlike Table 1, (ii) the logic code is not configured such that the numbers of sensing operations for reading logical page data are equalized.

Meanwhile, the weak read levels are the first read level R1 and the seventh read level R7. Both the first read level R1 and the seventh read level R7 are assigned to the LSB page for which the number of sensing operations is 4. That is, referring to Table 2, it can be seen that, unlike Table 1, (iii) the weak read levels R1 and R7 are not assigned to logical page data (MSB and CSB) for which the number of sensing operations is the smallest.

Finally, (iv) a plurality of weak read levels R1 and R7 are assigned to the LSB page, that is, one logical page. That is, it can be seen that the logic code corresponding to FIG. 8B is provided with feature (i), but is not provided with other features (ii) to (iv).

The logic code corresponding to FIG. 8A may be summarized, as shown in the following Table 3.

TABLE 3

| | Read voltage | | | | | | | |
|---|---|---|---|---|---|---|---|---|
| | E | R1 P1 | R2 P2 | R3 P3 | R4 P4 | R5 P5 | R6 P6 | R7 P7 |
| MSB | 1 | 1 | 0 | 0 | 1 | 1 | 0 | 0 |
| CSB | 1 | 1 | 1 | 0 | 0 | 0 | 0 | 1 |
| LSB | 1 | 0 | 0 | 0 | 0 | 1 | 1 | 1 |

Table 3 shows a logic code including all of the above-described features (i) to (iv). In accordance with the semiconductor memory device 100 and the method of operating the semiconductor memory device according to an embodiment of the present disclosure, a program operation is performed based on the logic code including the features (i) to (iv), as shown in Table 3. Therefore, when a read operation is performed after the program operation has been performed, a read error rate may be minimized, and the speed of the read operation may be improved. Consequently, the performance of the semiconductor memory device 100 may be enhanced.

In accordance with an embodiment of the present disclosure, the logic code used in the semiconductor memory device 100 for programming a TLC and the method of operating the semiconductor memory device is not limited to Table 3. For example, a TLC may be programmed using the logic code, such as that in the following Table 4.

TABLE 4

| | Read voltage | | | | | | | |
|---|---|---|---|---|---|---|---|---|
| | E | R1 P1 | R2 P2 | R3 P3 | R4 P4 | R5 P5 | R6 P6 | R7 P7 |
| MSB | 1 | 1 | 1 | 0 | 0 | 0 | 0 | 1 |
| CSB | 1 | 1 | 0 | 0 | 1 | 1 | 0 | 0 |
| LSB | 1 | 0 | 0 | 0 | 0 | 1 | 1 | 1 |

When Table 3 is compared with Table 4, a bit-program state mapping relationship corresponding to the MSB of Table 3 may match a bit-program state mapping relationship corresponding to the CSB of Table 4. Also, a bit-program state mapping relationship corresponding to the CSB of Table 3 may match the bit-program state mapping relationship corresponding to the MSB of Table 4. Meanwhile, a bit-program state mapping relationship corresponding to the LSB of Table 3 is identical to the bit-program state mapping relationship corresponding to the LSB of Table 4. That is, when a first row and a second row of Table 3 are exchanged with each other, the logic code of Table 4 may be obtained. Even in this case, the logic code satisfying all of the above features (i) to (iv) is configured. That is, the logic code including all of features (i) to (iv) may be obtained by changing the order of three rows included in the logic code of Table 3.

The logic code satisfying all of the features (i) to (iv) in programming of a TLC has been described with reference to FIGS. 8A and 8B. However, this is merely an example, and a logic code satisfying all features (i) to (iv) may be configured for a QLC which stores 4 bits of data. Further, even for a memory cell which stores 5 bits of data, a logic code satisfying all features (i) to (iv) may be configured. Hereinafter, an example of a logic code satisfying all features (i) to (iv) will be described in detail with reference to FIG. 9.

Figure 9:
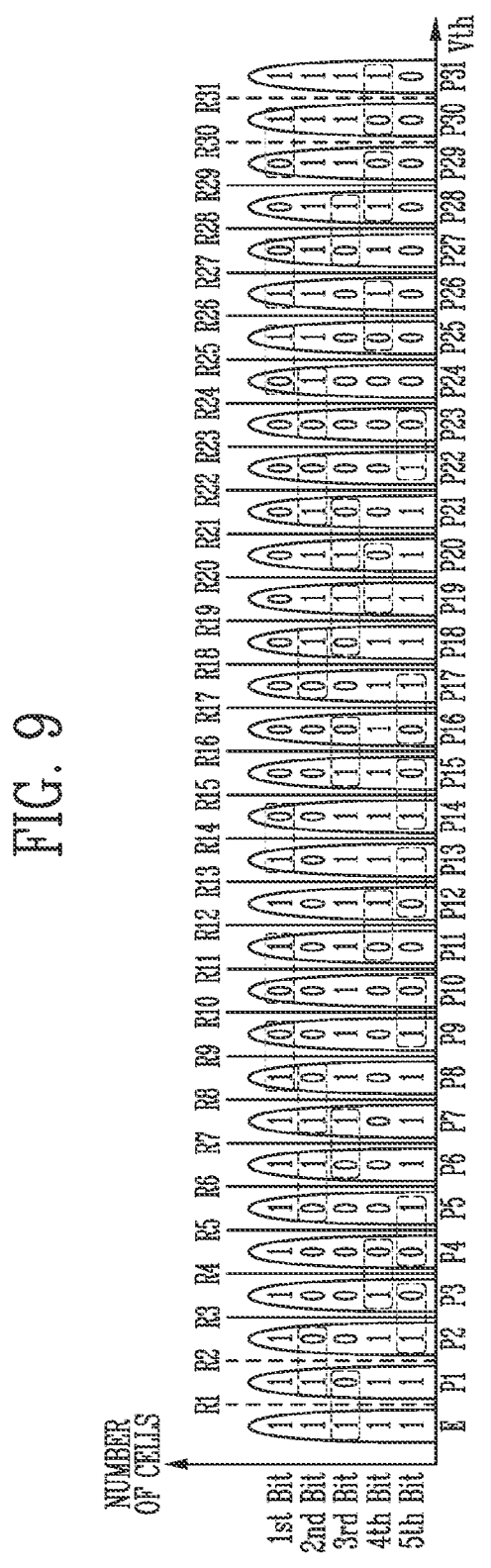

FIG. 9 is a diagram for describing a method of programming memory cells, each storing 5 bits of data, using a logic code according to an embodiment of the present disclosure.

Referring to FIG. 9, threshold voltage states of memory cells determined based on logic code according to an embodiment of the present disclosure are illustrated. In FIG. 9, memory cells which store bits "1 1 1 1 1" in the order of a first bit to a fifth bit are maintained in an erased state E. The memory cells which store bits "1 1 0 1 1" are programmed to a first program state P1. In this way, second to 31-st program states P2 to P31 are illustrated in FIG. 9. First to 31-st read levels R1 to R31 may be used to distinguish the threshold voltage states of respective memory cells from each other.

Referring to FIG. 9, as indicated by each dashed box, the erased state E and the first program state P1 are different from each other only in a third bit. Meanwhile, the first program state P1 and the second program state P2 are different from each other only in a second bit. As described above, in accordance with the threshold voltage states illustrated in FIG. 9, pieces of bit data corresponding to adjacent program states have a difference corresponding to only 1 bit therebetween. That is, FIG. 9 shows the threshold voltage states of memory cells programmed based on (i) "gray code".

In FIG. 9, the first and second read levels R1 and R2 vulnerable to disturb and the 30-th and 31-st read levels R30 and R31 vulnerable to retention are indicated by dotted lines as weak read levels. Read levels for reading respective pieces of logical page data illustrated in FIG. 9, the number of sensing operations thereof, and weak read levels are summarized in the following Table 5.

TABLE 5

| Logical Page | Read Level | Number of sensing operations | Weak Read Level |
|---|---|---|---|
| 1st Bit | R9, R11, R14, R25, R27, R30 | 6 | R30 |
| 2nd Bit | R2, R6, R8, R18, R22, R24 | 6 | R2 |
| 3rd Bit | R1, R7, R16, R19, R21, R28 | 6 | R1 |
| 4th Bit | R4, R12, R20, R26, R29, R31 | 6 | R31 |
| 5th Bit | R3, R5, R10, R13, R15, R17, R23 | 7 | X |

Referring to Table 5, the numbers of sensing operations required to read first to fifth bit pages may be 6, 6, 6, 6, and 7, respectively. It can be seen from the foregoing Equation (1) that a logic code has been configured such that $N_{RMAX}$ has a value of 7, $N_{Rmin}$ has a value of 5, and $N_{TH}$ has a value of 1. Therefore, referring to Table 5, the logic code has been configured such that (ii) the numbers of sensing operations for reading logical page data are equalized.

Meanwhile, the weak read levels may be the first read level R1, the second read level R2, the 30-th read level R30, and the 31-st read level R31. The first read level R1 is assigned to a third bit page for which the number of sensing operations is 6, and the second read level R2 is assigned to a second bit page for which the number of sensing operations is 6. The 30-th read level R30 is assigned to a first bit page for which the number of sensing operations is 6, and the 31-st read level R31 is assigned to a fourth bit page for which the number of sensing operations is 6. Therefore, it can be seen that (iii) the weak read levels R1, R2, R30, and R31 have been assigned to the third bit page, the second bit page, the first bit page, and a fourth bit page, respectively, for which the number of sensing operations is the smallest.

Finally, it can be seen that the plurality of weak read levels R1, R2, R30, and R31 are decentralized and assigned to the first to fourth bit pages that are different logical pages (LSB and CSB) rather than being assigned to any one logical page.

The logic code corresponding to FIG. 9 may be summarized, as shown in the following Table 6.

TABLE 6

| | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 1st Bit | 1 | 1 | 1 | 1 | 1 | 1 | 1 | 1 | 1 | 0 | 0 | 1 | 1 | 1 | 0 | 0 |
| 2nd Bit | 1 | 1 | 0 | 0 | 0 | 0 | 1 | 1 | 0 | 0 | 0 | 0 | 0 | 0 | 0 | 0 |
| 3rd Bit | 1 | 0 | 0 | 0 | 0 | 0 | 0 | 1 | 1 | 1 | 1 | 1 | 1 | 1 | 1 | 1 |
| 4th Bit | 1 | 1 | 1 | 1 | 0 | 0 | 0 | 0 | 0 | 0 | 0 | 0 | 1 | 1 | 1 | 1 |
| 5th Bit | 1 | 1 | 1 | 0 | 0 | 1 | 1 | 1 | 1 | 1 | 0 | 0 | 0 | 1 | 1 | 0 |

| | P16 | P17 | P18 | P19 | P20 | P21 | P22 | P23 | P24 | P25 | P26 | P27 | P28 | P29 | P30 | P31 |
|---|---|---|---|---|---|---|---|---|---|---|---|---|---|---|---|---|
| 1st Bit | 0 | 0 | 0 | 0 | 0 | 0 | 0 | 0 | 0 | 1 | 1 | 0 | 0 | 0 | 1 | 1 |
| 2nd Bit | 0 | 0 | 1 | 1 | 1 | 1 | 0 | 0 | 1 | 1 | 1 | 1 | 1 | 1 | 1 | 1 |
| 3rd Bit | 0 | 0 | 0 | 1 | 1 | 0 | 0 | 0 | 0 | 0 | 0 | 1 | 1 | 1 | 1 | 1 |
| 4th Bit | 1 | 1 | 1 | 1 | 0 | 0 | 0 | 0 | 0 | 0 | 1 | 1 | 1 | 0 | 0 | 1 |
| 5th Bit | 0 | 1 | 1 | 1 | 1 | 1 | 1 | 0 | 0 | 0 | 0 | 0 | 0 | 0 | 0 | 0 |

Meanwhile, in accordance with an embodiment of the present disclosure, the logic code used in the semiconductor memory device 100 for programming memory cells which store 5 bits of data and the method of operating the semiconductor memory device is not limited to Table 6. For example, memory cells which store 5 bits of data may be programmed using the logic code, such as that in the following Table 7.

TABLE 7

| | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 1st Bit | 1 | 1 | 0 | 0 | 0 | 0 | 1 | 1 | 0 | 0 | 0 | 0 | 0 | 0 | 0 | 0 |
| 2nd Bit | 1 | 1 | 1 | 1 | 1 | 1 | 1 | 1 | 1 | 0 | 0 | 1 | 1 | 1 | 0 | 0 |
| 3rd Bit | 1 | 1 | 1 | 0 | 0 | 1 | 1 | 1 | 1 | 1 | 0 | 0 | 0 | 1 | 1 | 0 |
| 4th Bit | 1 | 0 | 0 | 0 | 0 | 0 | 0 | 1 | 1 | 1 | 1 | 1 | 1 | 1 | 1 | 1 |
| 5th Bit | 1 | 1 | 1 | 1 | 0 | 0 | 0 | 0 | 0 | 0 | 0 | 0 | 1 | 1 | 1 | 1 |

| | P16 | P17 | P18 | P19 | P20 | P21 | P22 | P23 | P24 | P25 | P26 | P27 | P28 | P29 | P30 | P31 |
|---|---|---|---|---|---|---|---|---|---|---|---|---|---|---|---|---|
| 1st Bit | 0 | 0 | 1 | 1 | 1 | 1 | 0 | 0 | 1 | 1 | 1 | 1 | 1 | 1 | 1 | 1 |
| 2nd Bit | 0 | 0 | 0 | 0 | 0 | 0 | 0 | 0 | 0 | 1 | 1 | 0 | 0 | 0 | 1 | 1 |
| 3rd Bit | 0 | 1 | 1 | 1 | 1 | 1 | 1 | 0 | 0 | 0 | 0 | 0 | 0 | 0 | 0 | 0 |
| 4th Bit | 0 | 0 | 0 | 1 | 1 | 0 | 0 | 0 | 0 | 0 | 0 | 1 | 1 | 1 | 1 | 1 |
| 5th Bit | 1 | 1 | 1 | 1 | 0 | 0 | 0 | 0 | 0 | 0 | 1 | 1 | 1 | 0 | 0 | 1 |

Referring to Tables 6 and 7 together, a first row of Table 6 matches a second row of Table 7, and a second row of Table 6 matches a first row of Table 7. Meanwhile, a third row of Table 6 matches a fourth row of Table 7, and a fourth row of Table 6 matches a fifth row of Table 7. Finally, a fifth row of Table 6 matches a third row of Table 7. Even in this case, the logic code satisfying all of the above features (i) to (iv) is configured. In this way, the logic code including all of the features (i) to (iv) may be obtained by changing the order of three rows included in the logic code of Table 6.

Figure 10:
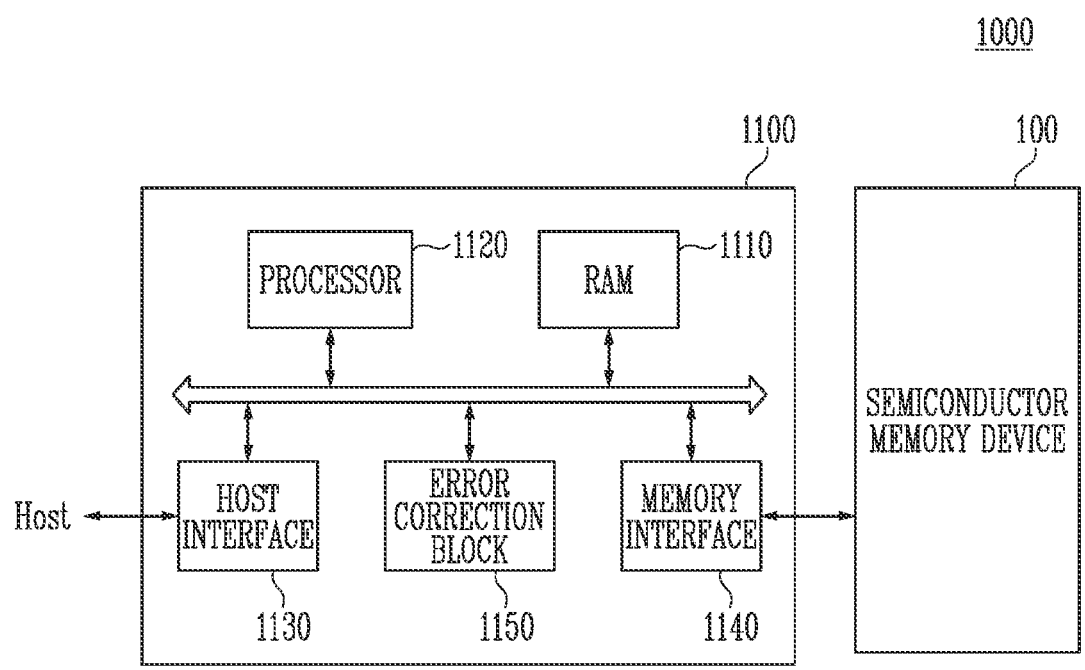
FIG. 10 is a block diagram illustrating a memory system 1000 having the semiconductor memory device 100 of FIG. 1.

FIG. 10 is a block diagram illustrating a memory system 1000 including the semiconductor memory device 100 of FIG. 1.

Referring to FIG. 10, the memory system 1000 may include the semiconductor memory device 100 and a memory controller 1100. The semiconductor memory device 100 may be the semiconductor memory device described with reference to FIG. 1. Hereinafter, repetitive explanations will be omitted.

The memory controller 1100 is coupled to a host Host and the semiconductor memory device 100. The memory controller 1100 may access the semiconductor memory device 100 in response to a request from the host Host. For example, the memory controller 1100 may control read, write, erase, and background operations of the semiconductor memory device 100. The memory controller 1100 may provide an interface between the semiconductor memory device 100 and the host Host. The memory controller 1100 may run firmware for controlling the semiconductor memory device 100.

The memory controller 1100 includes random access memory (RAM) 1110, a processor 1120, a host interface 1130, a memory interface 1140, and an error correction block 1150. The RAM 1110 is used as at least one of working memory for the processor 1120, cache memory between the semiconductor memory device 100 and the host Host, and is buffer memory between the semiconductor memory device 100 and the host. The processor 1120 may control the overall operation of the memory controller 1100. In addition, the memory controller 1100 may temporarily store program data provided from the host Host during a write operation.

The host interface 1130 includes a protocol for performing data exchange between the host Host and the memory controller 1100. In an embodiment, the memory controller 1100 may communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or NOR interface.

The error correction block 1150 may detect and correct errors in data received from the semiconductor memory device 100 using an error correction code (ECC). In an example embodiment, the error correction block 1150 may be provided as an element of the memory controller 1100.

The memory controller 1100 and the semiconductor memory device 100 may be integrated into a single semiconductor device. In an embodiment, the memory controller 1100 and the semiconductor memory device 100 may be integrated into a single semiconductor device to form a memory card. For example, the memory controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS) device.

The memory controller 1100 and the semiconductor memory device 100 may be integrated into a single semiconductor device to form a solid state drive (SSD). The SSD includes a storage device configured to store data in semiconductor memory. When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 11:
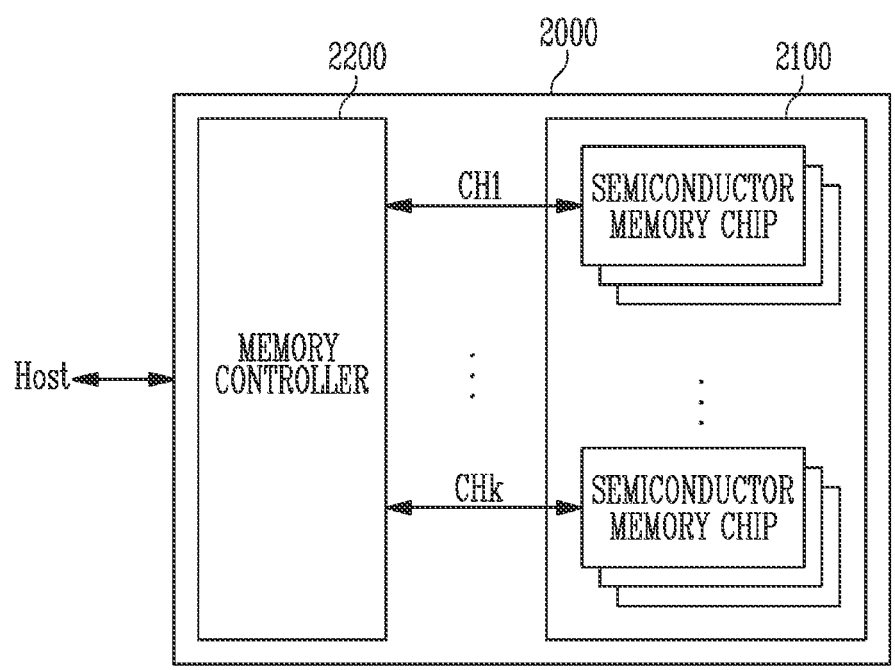
FIG. 11 is a block diagram illustrating an application of the memory system of FIG. 10.

FIG. 11 is a block diagram illustrating an example application of the memory system 1000 of FIG. 10.

Referring to FIG. 11, a memory system 2000 may include a semiconductor memory device 2100 and a memory controller 2200. The semiconductor memory device 2100 may include a plurality of semiconductor memory chips. The semiconductor memory chips are divided into a plurality of groups.

In FIG. 11, it is illustrated that the plurality of groups communicate with the memory controller 2200 through first to k-th channels CH1 to CHk. Each semiconductor memory chip may be configured and operated in the same manner as those of the semiconductor memory device 100 described with reference to FIG. 1.

Each group may communicate with the memory controller 2200 through one common channel. The memory controller 2200 may have the same configuration as the memory controller 1100 described with reference to FIG. 10, and may control the plurality of memory chips of the semiconductor memory device 2100 through the plurality of channels CH1 to CHk.

Figure 12:
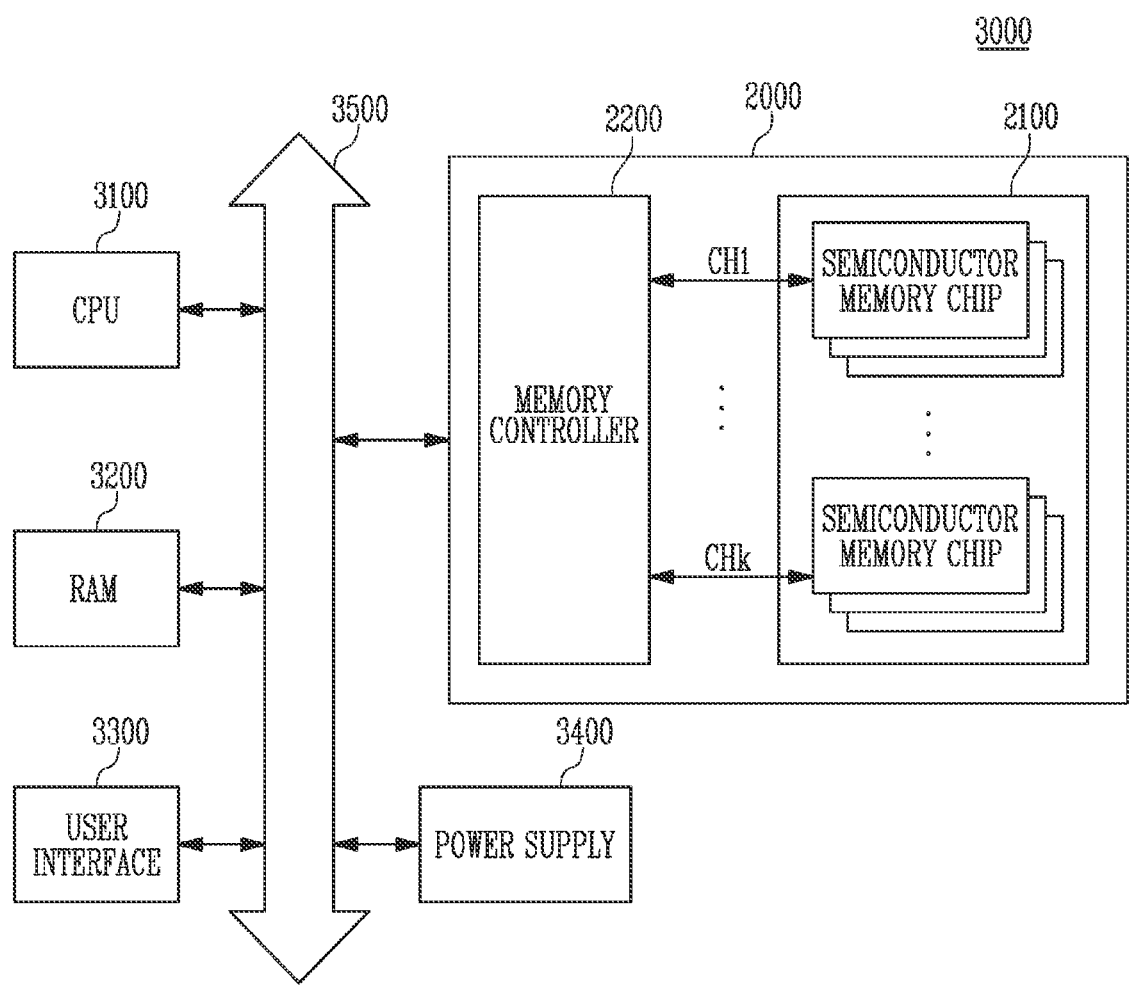
FIG. 12 is a block diagram illustrating a computing system including the memory system described with reference to FIG. 11.

FIG. 12 is a block diagram illustrating a computing system including the memory system 2000 described with reference to FIG. 11.

A computing system 3000 includes a central processing unit (CPU) 3100, a RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 12, a semiconductor memory device 2100 is illustrated as being coupled to the system bus 3500 through the memory controller 2200. However, the semiconductor memory device 2100 may be directly coupled to the system bus 3500. Here, the function of the memory controller 2200 may be performed by the CPU 3100 and the RAM 3200.

In FIG. 12, the memory system 2000 described with reference to FIG. 11 is illustrated as being provided. However, the memory system 2000 may be replaced with the memory system 1000 described with reference to FIG. 10. In an embodiment, the computing system 3000 may include both the memory systems 1000 and 2000 described with reference to FIGS. 10 and 11.

The present disclosure may provide a semiconductor memory device, which can improve read performance of programmed data after programming of data, and a method of operating the semiconductor memory device.

What is claimed is:

1. A semiconductor memory device, comprising:
    a memory cell array including a plurality of memory cells, each of which stores N bits of data, where N is a natural number of 2 or more; and
    a peripheral circuit configured to perform a program operation on a physical page including memory cells selected from among the plurality of memory cells,
    wherein the peripheral circuit is configured to receive data corresponding to N logical pages and program the data corresponding to the N logical pages to the physical page based on a logic code,
    wherein the logic code is determined to equalize numbers of sensing operations required to read the data corresponding to the N logical pages, respectively, and
    wherein weak read levels are assigned, according to the logic code, to read data of a logical page, among the N logical pages, for which the number of sensing operations is smallest.

2. The semiconductor memory device according to claim 1, wherein N is 3 and each of the selected memory cells is determined to belong to any one of eight threshold voltage states.

3. The semiconductor memory device according to claim 2, wherein:
first to seventh read levels are used to distinguish the eight threshold voltage states, and
the weak read levels are a first read level and a seventh read level, among the first to seventh read levels.

4. The semiconductor memory device according to claim 3, wherein the logic code is configured such that:
a second read level, a fourth read level, and a sixth read level are used to read data corresponding to a first logical page among the three logical pages,
a third read level and a seventh read level are used to read data corresponding to a second logical page among the three logical pages, and
a first read level and a fifth read level are used to read data corresponding to a third logical page among the three logical pages.

5. The semiconductor memory device according to claim 1, wherein N is 5 and each of the selected memory cells is determined to belong to any one of 32 threshold voltage states.

6. The semiconductor memory device according to claim 5, wherein:
first to 31-st read levels are used to distinguish the 32 threshold voltage states from each other, and
the weak read levels are a first read level, a second read level, a 30-th read level, and a 31-st read level.

7. The semiconductor memory device according to claim 6, wherein the logic code is configured such that:
ninth, eleventh, fourteenth, 25-th, 27-th, and 30-th read levels are used to read data corresponding to a first logical page among the five logical pages,
second, sixth, eighth, eighteenth, 22-nd, and 24-th read levels are used to read data corresponding to a second logical page among the five logical pages,
first, seventh, sixteenth, nineteenth, 21-st, and 28-th read levels are used to read data corresponding to a third logical page among the five logical pages,
fourth, twelfth, twentieth, 26-th, 29-th, and 31-st read levels are used to read data corresponding to a fourth logical page among the five logical pages, and
third, fifth, tenth, thirteenth, fifteenth, seventeenth, and 23-rd read levels are used to read data corresponding to a fifth logical page among the five logical pages.

8. The semiconductor memory device according to claim 1, wherein the logic code is a gray code.

9. A method of operating a semiconductor memory device including a plurality of memory cells, wherein each of the memory cells stores N bits of data and memory cells included in one physical page store data corresponding to N logical pages, the method comprising:
receiving data corresponding to N logical pages from a memory controller;
determining threshold voltage states of memory cells selected from among the plurality of memory cells based on the data corresponding to the N logical pages and a logic code; and
programming the selected memory cells based on the determined threshold voltage states,
wherein the logic code is determined to equalize numbers of sensing operations required to read the data corresponding to the N logical pages, respectively, and
wherein weak read levels are assigned, according to the logic code, to read data of a logical page, among the N logical pages, for which the number of sensing operations is smallest.

10. The method according to claim 9, wherein N is 3 and each of the selected memory cells is determined to belong to any one of eight threshold voltage states.

11. The method according to claim 10, wherein, among the three logical pages:
two sensing operations are assigned to read a first logical page;
two sensing operations are assigned to read a second logical page; and
three sensing operations are assigned to read a third logical page.

12. The method according to claim 11, wherein the weak read levels are assigned to read the first and second logical pages.

13. The method according to claim 9, wherein N is 5 and each of the selected memory cells is determined to belong to any one of 32 threshold voltage states.

14. The method according to claim 13, wherein, among the five logical pages:
six sensing operations are assigned to read a first logical page;
six sensing operations are assigned to read a second logical page;
six sensing operations are assigned to read a third logical page;
six sensing operations are assigned to read a fourth logical page; and
seven sensing operations are assigned to read a fifth logical page.

15. The method according to claim 14, wherein the weak levels are assigned to read the first and second logical pages.

16. A semiconductor memory device, comprising:
a memory cell array including a plurality of memory cells, each of which stores N bits of data, where N is a natural number of 2 or more; and
a peripheral circuit configured to perform a program operation on a physical page including memory cells selected from among the plurality of memory cells,
wherein the peripheral circuit is configured to receive data corresponding to N logical pages and program the data corresponding to the N logical pages to the physical page based on a logic code,
wherein the logic code is determined to equalize numbers of sensing operations required to read the data corresponding to the N logical pages, respectively, and
wherein, among a first read level to a $(2^N-1)$-th read level having sequential magnitudes to distinguish $2^N$ threshold voltage states from each other, the first read level that is a lowest read level and the $(2^N-1)$-th read level that is a highest read level are assigned to read data corresponding to different logical pages among the data corresponding to the N logical pages.

17. The semiconductor memory device according to claim 16, wherein:
N is 3 and each of the selected memory cells is determined to belong to any one of eight threshold voltage states, and
a first read level and a seventh read level, among the first read level to the seventh read levels having sequential values, are assigned to read data corresponding to different logical pages.

18. The semiconductor memory device according to claim 16, wherein:
N is 5 and each of the selected memory cells is determined to belong to any one of 32 threshold voltage states, and a first read level and a 31-st read level, among the first read level to the 31-st read levels having sequential values, are assigned to read data corresponding to different logical pages.

19. The semiconductor memory device according to claim 18, wherein, among the first read level to the 31-st read level, the first read is level, a second read level, a 30-th read level, and the 31-st read level are assigned to read different logical pages, respectively.

* * * * *